United States Patent
Zang et al.

(10) Patent No.: US 10,832,967 B2
(45) Date of Patent: Nov. 10, 2020

(54) TAPERED FIN-TYPE FIELD-EFFECT TRANSISTORS

(71) Applicant: GLOBALFOUNDRIES Inc., Grand Cayman OT (KY)

(72) Inventors: Hui Zang, Guilderland, NY (US); Ruilong Xie, Niskayuna, NY (US); Garo Jacques Derderian, Saratoga Springs, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 8 days.

(21) Appl. No.: 16/101,963

(22) Filed: Aug. 13, 2018

(65) Prior Publication Data
US 2020/0051868 A1    Feb. 13, 2020

(51) Int. Cl.
*H01L 21/8234* (2006.01)
*H01L 29/66* (2006.01)
*H01L 29/06* (2006.01)
*H01L 27/088* (2006.01)

(52) U.S. Cl.
CPC ........ *H01L 21/823481* (2013.01); *H01L 21/823431* (2013.01); *H01L 27/0886* (2013.01); *H01L 29/0649* (2013.01); *H01L 29/66545* (2013.01); *H01L 29/66795* (2013.01)

(58) Field of Classification Search
CPC ..... H01L 21/823431; H01L 21/823821; H01L 21/823481; H01L 27/0886; H01L 27/0924; H01L 29/66795; H01L 29/0649; H01L 29/66545

USPC .......... 438/283, 296, 424; 257/401
See application file for complete search history.

(56) References Cited

U.S. PATENT DOCUMENTS

| | | | |
|---|---|---|---|
| 9,305,845 B2 | 4/2016 | Colburn et al. | |
| 9,425,106 B1 | 8/2016 | Xie et al. | |
| 9,818,876 B1 | 11/2017 | Bouche | |
| 9,842,931 B1 | 12/2017 | Anderson et al. | |
| 9,905,473 B1 * | 2/2018 | Bouche | H01L 21/823418 |
| 2014/0317581 A1 | 10/2014 | Chuang et al. | |
| 2015/0325575 A1 * | 11/2015 | Park | H01L 29/0653 |
| | | | 257/401 |
| 2016/0284706 A1 * | 9/2016 | Chung | H01L 29/7846 |
| 2016/0380075 A1 * | 12/2016 | Chung | H01L 29/7855 |
| | | | 257/190 |
| 2019/0164971 A1 * | 5/2019 | Liaw | H01L 29/66795 |
| 2019/0319027 A1 * | 10/2019 | Chung | H01L 27/0207 |

FOREIGN PATENT DOCUMENTS

KR    10-2018-0042197    *    4/2018

* cited by examiner

*Primary Examiner* — Mohammed Shamsuzzaman
*Assistant Examiner* — Aaron J Gray
(74) *Attorney, Agent, or Firm* — Thompson Hine LLP; Francois Pagette (57) ABSTRACT

Device structures and fabrication methods for a field-effect transistor. A semiconductor fin includes a first section and a second section in a lengthwise arrangement, a first gate structure overlapping the first section of the semiconductor fin, and a second gate structure overlapping the second section of the semiconductor fin. A pillar is arranged in the first section of the semiconductor fin. The pillar extends through a height of the semiconductor fin and across a width of the semiconductor fin.

10 Claims, 10 Drawing Sheets

FIG. 12

US 10,832,967 B2

TAPERED FIN-TYPE FIELD-EFFECT TRANSISTORS

BACKGROUND

The invention relates generally to semiconductor device and integrated circuit fabrication and, in particular, to device structures and fabrication methods for a field-effect transistor.

Complementary-metal-oxide-semiconductor (CMOS) processes may be used to build a combination of p-type and n-type field-effect transistors that are used to construct logic gates and that provide active components in other types of circuits, such as switches found in radiofrequency circuits. Field-effect transistors generally include a channel region, a source, a drain, and a gate electrode. When a control voltage exceeding a characteristic threshold voltage is applied to the gate electrode, carrier flow occurs in a channel defined in the channel region between the source and drain to produce a device output current.

A fin-type field-effect transistor (FinFET) is a non-planar device structure that may be more densely packed in an integrated circuit than planar field-effect transistors. A fin-type field-effect transistor may include a fin consisting of a three-dimensional body of semiconductor material, heavily-doped source and drain regions, and a gate electrode that wraps about the fin body between the source and drain regions. The arrangement between the gate structure and fin body improves control over the channel and reduces the leakage current when the fin-type field-effect transistor is in its 'Off' state in comparison with planar field-effect transistors. This, in turn, enables the use of lower threshold voltages than in planar field-effect transistors, and results in improved performance and lowered power consumption.

A tapered device is formed from a sea of fins by patterning the fins so that FinFETs with different numbers of fins can be formed adjacent to each other on the same active region of the substrate. The patterning process relies on an etch mask with an opening that may have rounded corners, instead of right angle corners. The result is that the ends of the cut fins may be damaged due to artifacts arising from the rounded corners of the opening in the etch mask. For example, the tips or ends of the cut fins may not have a uniform width after being etched when masked by one of the rounded corners. A tapered device may alternatively be formed by double-patterning layout techniques, where two colors are employed for two separate etch masks. However, double-patterning layout techniques may suffer from lack of overlay control, which may result in misalignment.

Improved device structures and fabrication methods for a field-effect transistor are needed.

SUMMARY

In an embodiment of the invention, a structure includes a semiconductor fin with a first section and a second section in a lengthwise arrangement, a first gate structure in an overlapping relationship with the first section of the semiconductor fin, and a second gate structure in an overlapping relationship with the second section of the semiconductor fin. A pillar is arranged in the first section of the semiconductor fin. The pillar extends through a height of the semiconductor fin and across a width of the semiconductor fin.

In an embodiment of the invention, a method includes forming a semiconductor fin including a first section and a second section in a lengthwise arrangement, and forming a first gate structure arranged to respectively overlap with the first section of the semiconductor fin and a second gate structure arranged to overlap with the second section of the semiconductor fin. The method further includes removing the first gate structure from the first section of the semiconductor fin to expose a portion of the first section of the semiconductor fin, and etching the portion of the first section of the semiconductor fin to form a cavity extending through a height of the semiconductor fin and across a width of the semiconductor fin. A dielectric material is formed in a lower portion of the first cavity to thereby form a pillar in the first section of the semiconductor fin.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
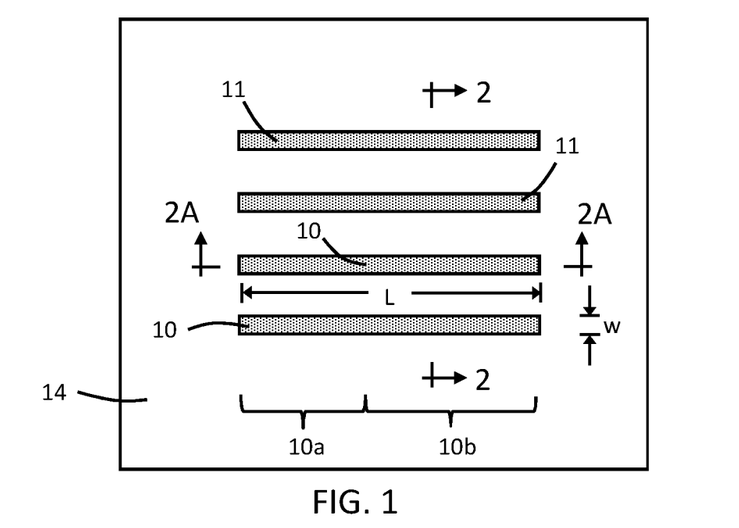
FIG. 1 is a top view of a device structure at an initial fabrication stage of a processing method in accordance with embodiments of the invention.
Figure 2:
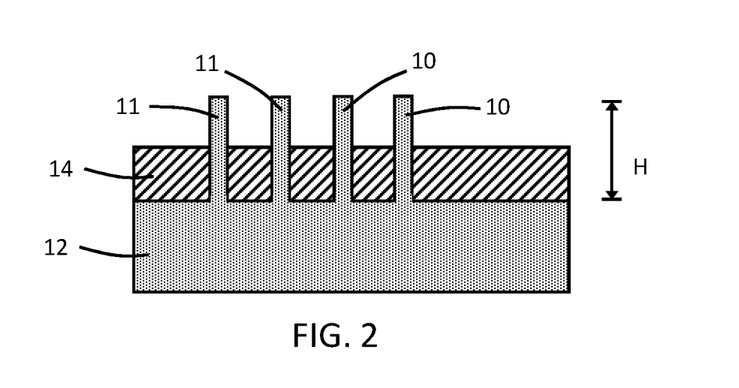
FIG. 2 is cross-sectional view taken generally along line 2-2 in FIG. 1.
Figure 2A:
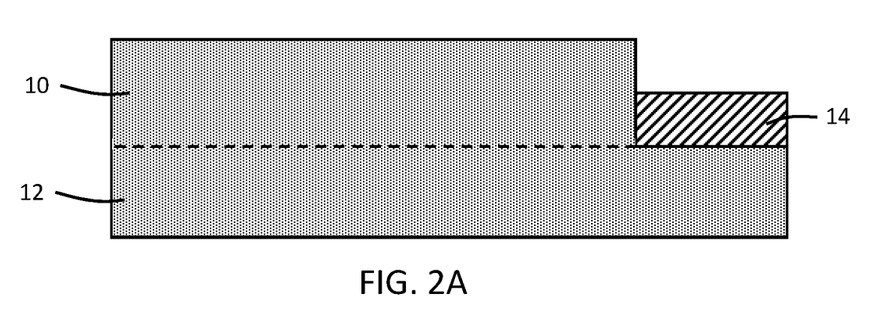
FIG. 2A is cross-sectional view taken generally along line 2A-2A in FIG. 1.

With reference to FIGS. 1, 2, 2A and in accordance with embodiments of the invention, a device structure includes semiconductor fins 10, 11 that are arranged over a substrate 12, such as a bulk single-crystal silicon substrate. The semiconductor fins 10, 11 project in a vertical direction relative to respective horizontal interfaces with the substrate 12 and may be aligned parallel to each other. The semiconductor fins 10, 11 contain a single-crystal semiconductor material, such as single-crystal silicon. The semiconductor fins 10, 11 may be formed by patterning the substrate 12 or an epitaxial layer grown on the substrate 12 using, for example, self-aligned double patterning (SADP). The semiconductor fins 10, 11 have a height, H, measured relative to the substrate 12 and a width, W, and extend along a length, L. Each of the semiconductor fins 10 includes a lengthwise section 10b that is subsequently removed, as described hereinbelow, in order to form a tapered device and a lengthwise section 10a that is not removed and that remains intact.

Shallow trench isolation regions 14 are arranged to surround and bury a lower section of each of the semiconductor fins 10, 11. Each of the semiconductor fins 10, 11 includes an upper section that is revealed above a top surface of the shallow trench isolation regions 14. In an embodiment, the shallow trench isolation regions 14 may be composed of a dielectric material, such as silicon dioxide ($SiO_2$), deposited by chemical vapor deposition (CVD) and, subsequent to deposition, recessed with an etching process to reveal the upper sections of the semiconductor fins 10, 11.

Figure 3:
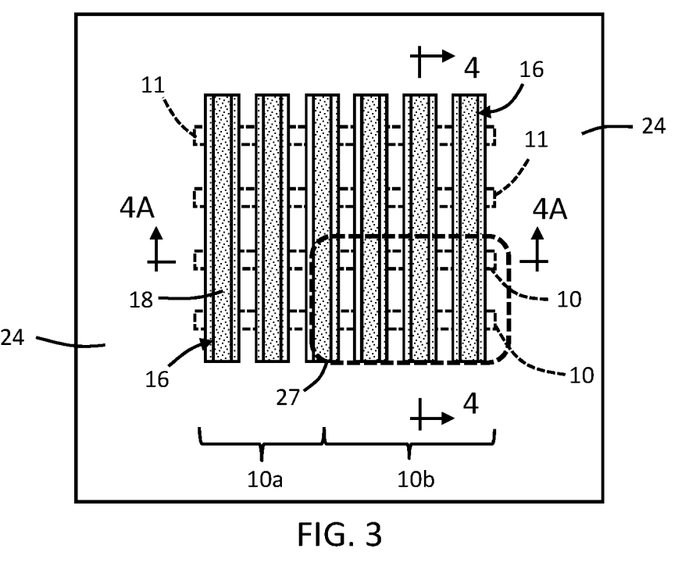
FIG. 3 is a top view of the device structure at a fabrication stage of the processing method subsequent to FIG. 1.
Figure 4:
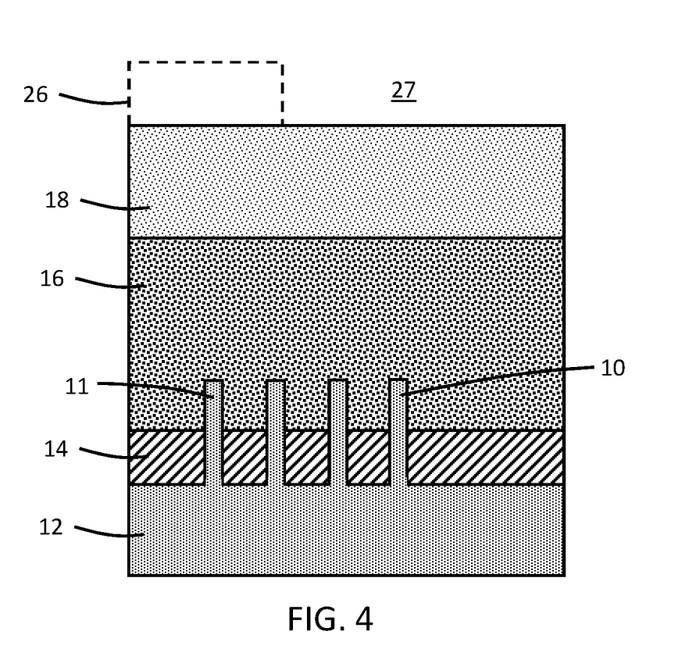
FIG. 4 is cross-sectional view taken generally along line 4-4 in FIG. 3.
Figure 4A:
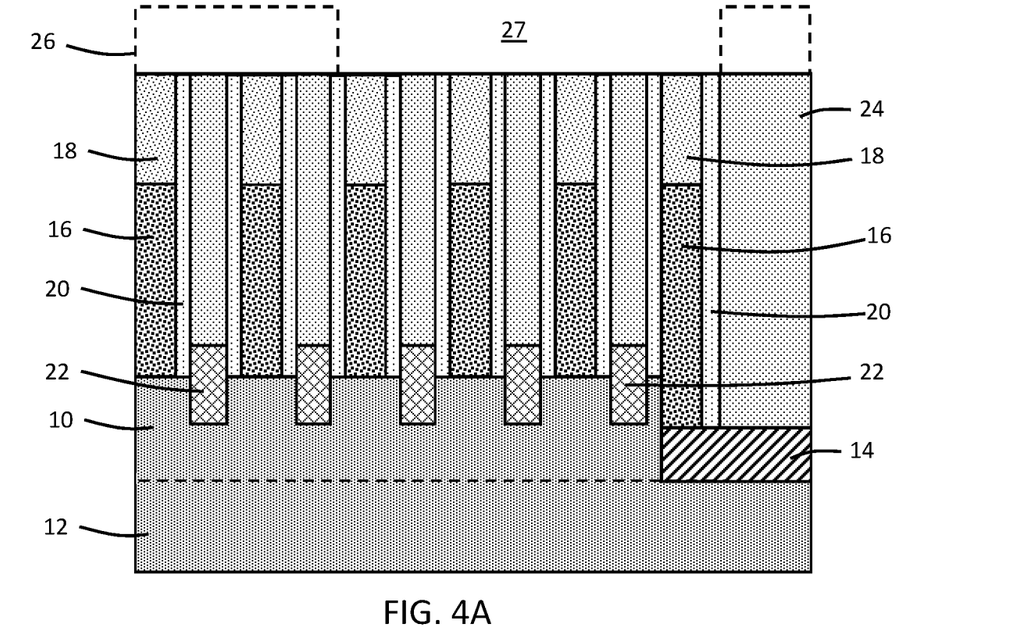
FIG. 4A is cross-sectional view taken generally along line 4A-4A in FIG. 3.

With reference to FIGS. 3, 4, 4A in which like reference numerals refer to like features in FIGS. 1, 2, 2A and at a subsequent fabrication stage, gate structures 16 are formed that intersect and overlap with the semiconductor fins 10, 11. The gate structures 16 also extend across the shallow trench isolation regions 14 in the gaps between the semiconductor fins 10, 11. The gate structures 16, which are lengthwise oriented transverse to the lengths of the semiconductor fins 10, 11, have an overlapping relationship with respective channel regions in the semiconductor fins 10, 11 and the locations of the overlap are spaced apart from each other. In particular, some of the gate structures 16 overlap with and extend across the section 10a of each semiconductor fin 10, and other of the gate structures 16 overlap with and extend across the section 10b of each semiconductor fin 10.

Each of the gate structures 16 may include a dummy gate composed of an amorphous semiconductor material, such as amorphous silicon, and may further include a thin dielectric layer (e.g., silicon dioxide ($SiO_2$)) arranged between the dummy gate and the exterior surfaces of the semiconductor fins 10, 11. The gate structures 16 may be formed by depositing the materials of the dummy gate and thin dielectric layer over the semiconductor fins 10, 11 and the shallow trench isolation regions 14, and patterning the materials with lithography and etching processes. The gate structures 16 may be sacrificial placeholders for permanent gate structures that are formed as part of a gate-last process in a subsequent fabrication stage.

A cap 18 is arranged on the top surface of each gate structure 16 and may be a remnant from the patterning of the gate structures 16. The caps 18 may be composed of a dielectric material, such as silicon nitride ($Si_3N_4$), deposited by chemical vapor deposition.

Sidewall spacers 20 are formed adjacent to the sidewalls of each gate structure 16 and its associated cap 18. The sidewall spacers 20 may be composed of a dielectric material, such as a low-k dielectric material having a dielectric constant (i.e., permittivity) less than the dielectric constant of silicon nitride ($Si_3N_4$). Low-k dielectric materials suitable for forming the sidewall spacers 20 include, but are not limited to, silicon oxycarbonitride (SiOCN) or carbon-incorporated silicon oxide (SiOC) deposited as a conformal layer by atomic layer deposition (ALD) and etched with a directional etching process, such as reactive ion etching.

Source/drain regions 22 are arranged adjacent to the spacer-clad gate structures 16 and may be formed at least in part within cavities in the semiconductor fins 10, 11 that are defined by a self-aligned etching process, such as a reactive ion etching (ME) process. As used herein, the term "source/drain region" means a doped region of semiconductor material that can function as either a source or a drain of a field-effect transistor. The source/drain regions 22 may be formed of semiconductor material grown by an epitaxial growth process. For an n-type field-effect transistor, the source/drain regions 22 may be composed of epitaxially-grown semiconductor material doped during epitaxial growth with an n-type dopant from Group V of the Periodic Table (e.g., phosphorus (P) or arsenic (As)) to provide n-type conductivity. For a p-type field-effect transistor, the source/drain regions 22 may be composed of epitaxially-grown semiconductor material doped during epitaxial growth with a p-type dopant selected from Group III of the Periodic Table (e.g., boron (B)) to provide p-type conductivity.

An interlayer dielectric layer 24 is formed having sections that overlie and cover the source/drain regions 22 and that fill the gaps between the gate structures 16. The interlayer dielectric layer 24 may be composed of a dielectric material, such as silicon dioxide ($SiO_2$) deposited by a flowable chemical vapor deposition (FCVD) process and planarized by chemical mechanical polishing (CMP) to be coplanar with the top surface of the caps 18. The sections of the interlayer dielectric layer 24 define sacrificial structures that are temporary placeholders removed and replaced by contacts in subsequent fabrication stages of the processing method. A thin layer (not shown) of a different dielectric material, such as silicon nitride, may be deposited in the gaps between the gate structures 16 before depositing the interlayer dielectric layer 24.

A removable etch mask 26 is formed that includes an opening 27 aligned and overlapping with the lengthwise sections 10b of the semiconductor fins 10 to be subsequently removed in order to form a tapered device. The etch mask 26 may include an organic planarization layer (OPL) material that is applied by spin-coating and patterned with lithography and etching processes to form the opening 27. The etch mask 26 masks the semiconductor fins 11 and the other sections 10a of the semiconductor fins 10 that are retained and not to be removed. The sections 10b of the semiconductor fins 10 that are arranged inside the boundary of the opening 27 are effectively removed in subsequent fabrication stages to define a tapered device region.

Figure 5:
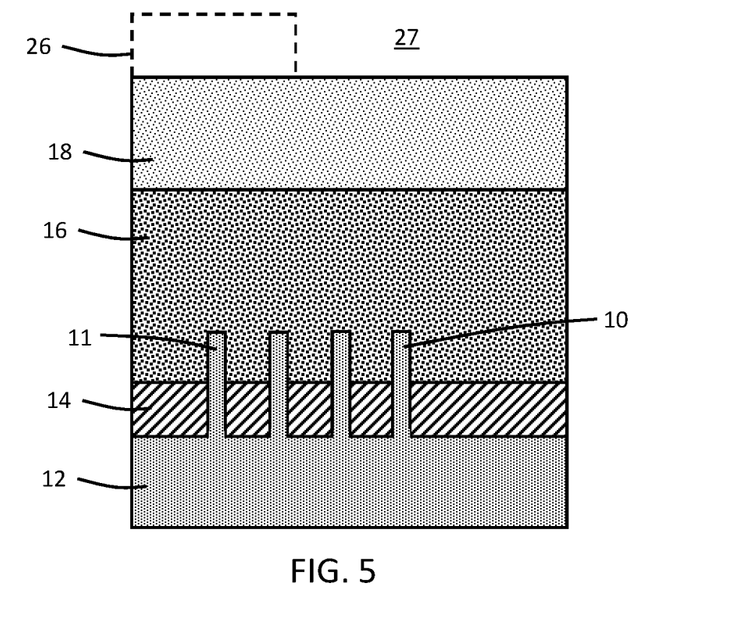
FIGS. 5-11 and 5A-11A are cross-sectional views of the device structure at successive fabrication stages respectively subsequent to FIGS. 4 and 4A.
Figure 5A:
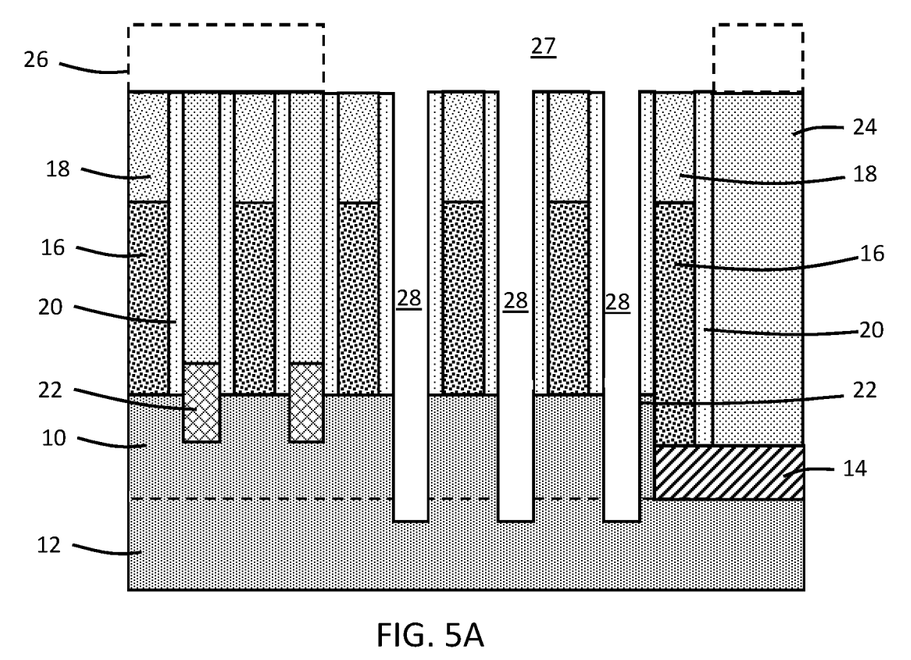

With reference to FIGS. 5, 5A in which like reference numerals refer to like features in FIGS. 4, 4A and at a subsequent fabrication stage, the sections of the interlayer dielectric layer 24 exposed inside the boundary of the opening 27 in the etch mask 26 are removed with an etching process, such as a reactive ion etching process. Sections of the source/drain regions 22 are exposed by the removal of the sections of the interlayer dielectric layer 24, and these exposed sections are removed with an etching process, such as a reactive ion etching process. The removal of the sections of the source/drain regions 22 exposes underlying portions of the sections 10b of semiconductor fins 10. The etching process removing the source/drain regions 22 may be extended to etch fully through these exposed portions of the sections 10b of semiconductor fins 10 and to penetrate to a shallow depth into the substrate 12. During the etching process, the caps 18 and sidewall spacers 20 mask the sections of the gate structures 16 that are exposed inside the boundary of the opening 27 in the etch mask 26. Cavities or trenches 28 are defined at the locations of the removed sections of the interlayer dielectric layer 24, removed source/drain regions 22, and removed portions of the sections 10b of semiconductor fins 10. The formation of the trenches 28 removes portions of the sections 10b of semiconductor fins 10 that are arranged below the source/drain regions 22.

Figure 6:
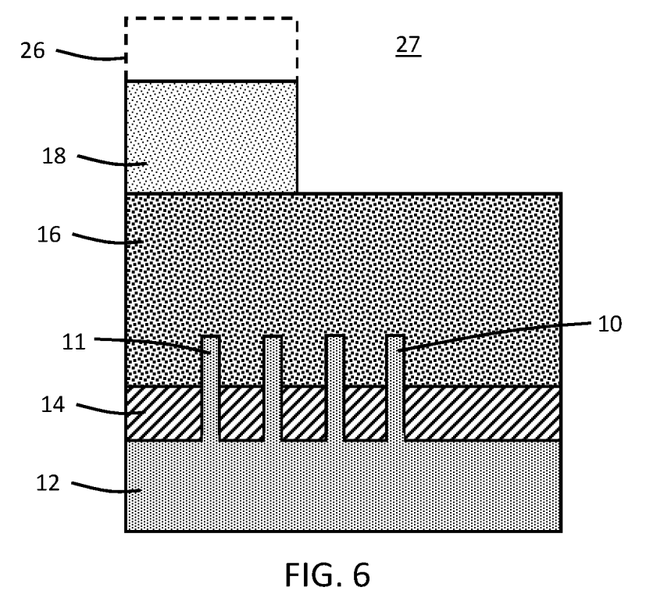
Figure 6A:
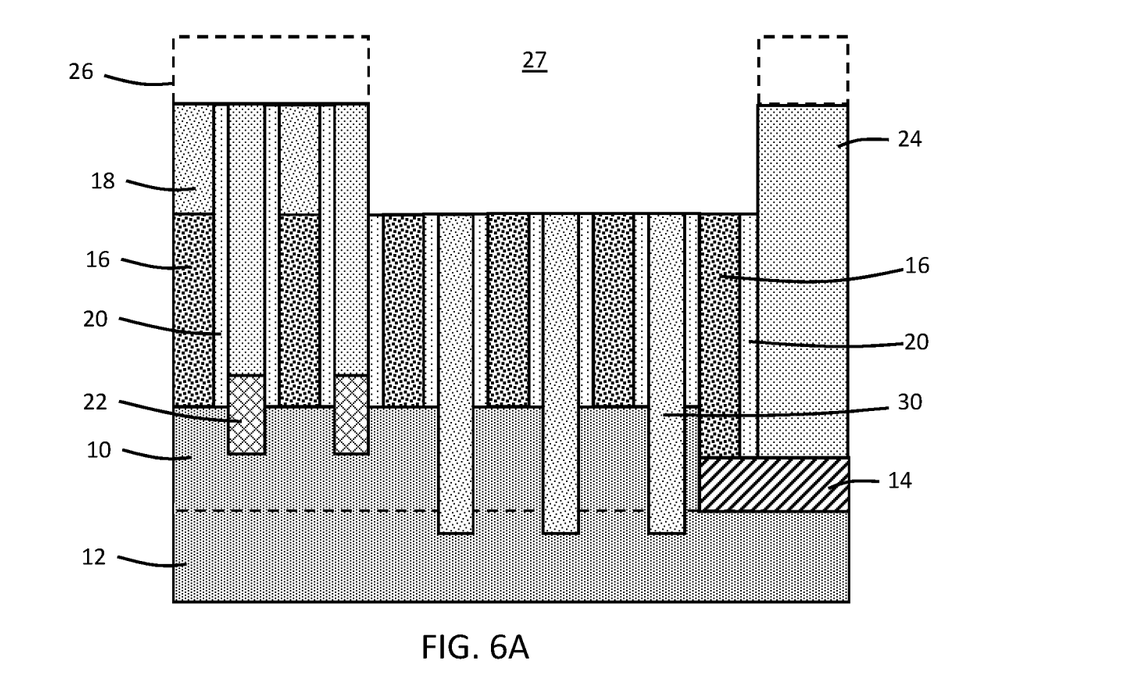

With reference to FIGS. 6, 6A in which like reference numerals refer to like features in FIGS. 5, 5A and at a subsequent fabrication stage, pillars 30 are formed in the trenches 28 (FIG. 5A). The pillars 30 may be composed of a dielectric material, such as silicon nitride, deposited by plasma-enhanced atomic layer deposition (PEALD) and etched back with an etching process, such as a reactive ion etching process. The dielectric materials constituting the caps 18 and sidewall spacers 20 may be removed when the pillars 30 are etched back such that sections of the gate structures 16 are exposed over the area inside the boundary of the opening 27. The etched-back dielectric material of the pillars 30 may be coplanar with the gate structures 16. The pillars 30 extend across the entire width of the sections 10b of the semiconductor fins 10 and through the full height of the sections 10b of the semiconductor fins 10. The pillars 30 are also part of a dielectric layer formed inside the opening 27 in the etch mask 26 that extends over the shallow trench isolation regions 14 between the sidewall spacers 20 and between the semiconductor fins 10.

Figure 7:
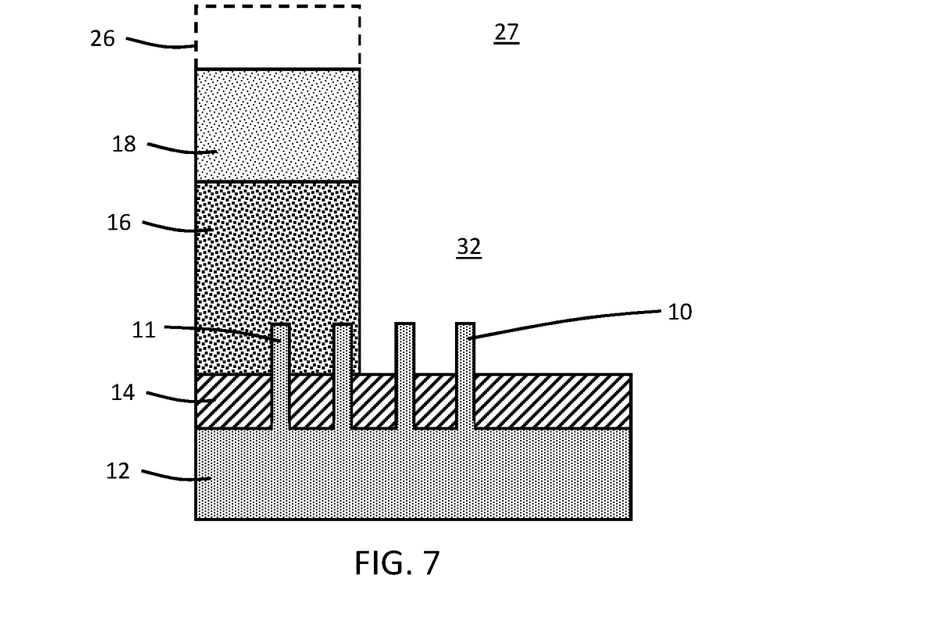
Figure 7A:
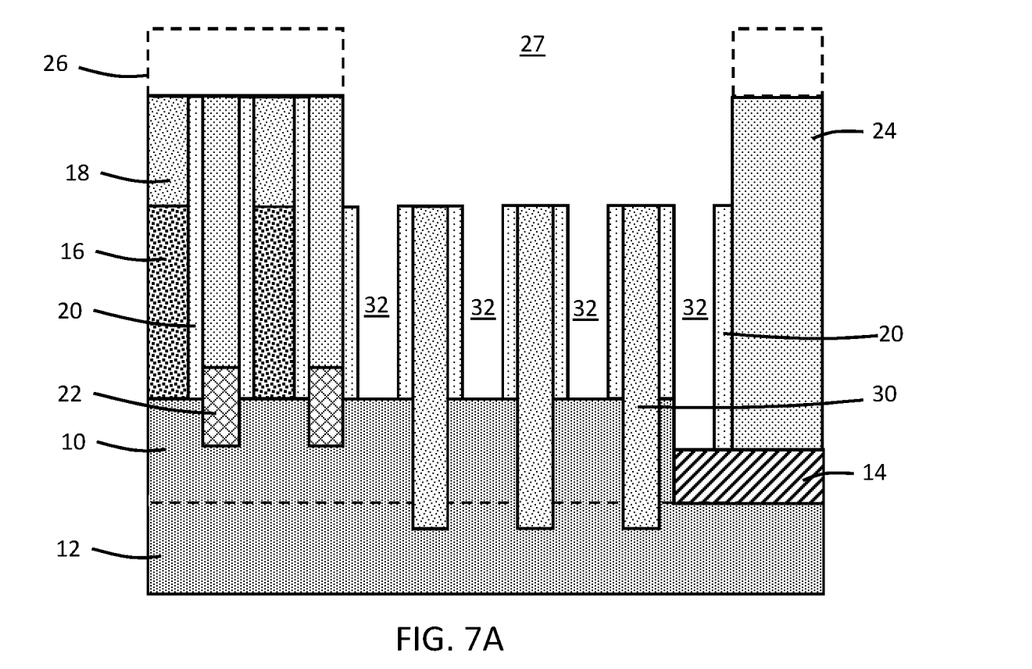

With reference to FIGS. 7, 7A in which like reference numerals refer to like features in FIGS. 6, 6A and at a subsequent fabrication stage, sections of the gate structures 16 inside the boundary of the opening 27 in the etch mask 26 are pulled and removed selective to the pillars 30 and the sidewall spacers 20 with an etching process, such as reactive ion etching, using an etch chemistry selected to provide the etch selectivity. As used herein, the term "selective" in reference to a material removal process (e.g., etching) denotes that, with an appropriate etchant choice, the material removal rate (i.e., etch rate) for the targeted material is greater than the removal rate for at least another material exposed to the material removal process. The removal of the sections of the gate structures 16 opens cavities or trenches 32 between the sidewall spacers 20 that extend from a top surface of the sidewall spacers 20 to portions of the sections 10b of semiconductor fins 10 that are exposed at the bottom of the trenches 32.

Figure 8:
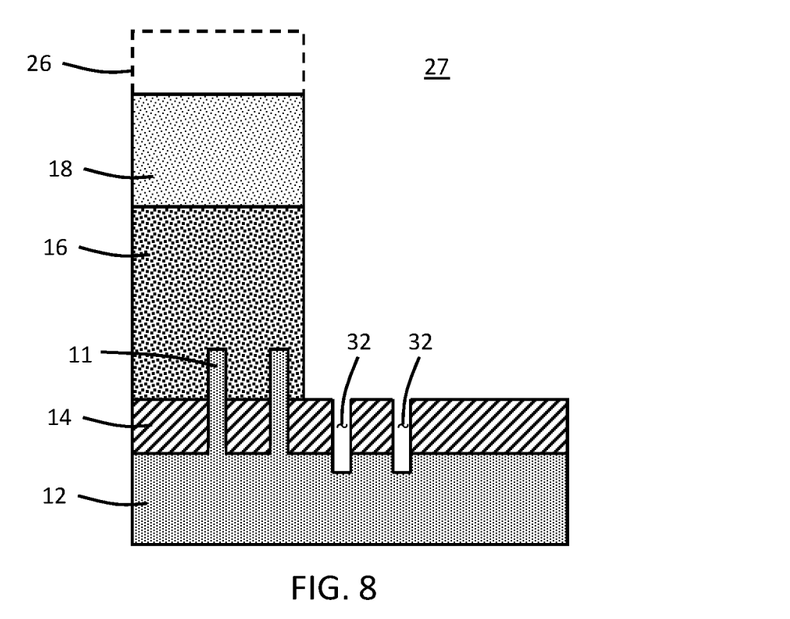
Figure 8A:
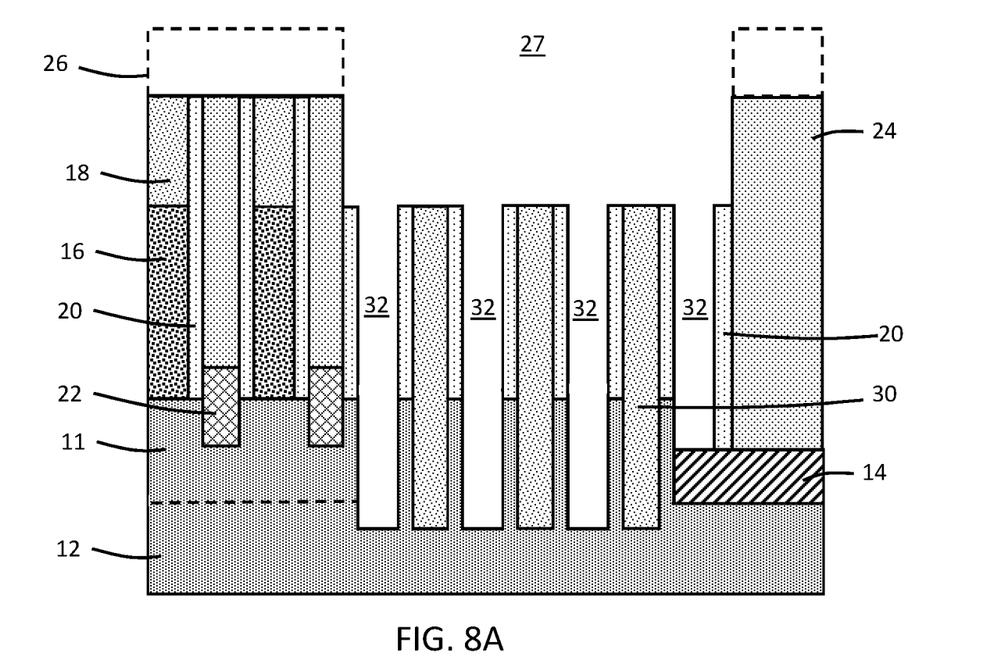

With reference to FIGS. 8, 8A in which like reference numerals refer to like features in FIGS. 7, 7A and at a subsequent fabrication stage, the trenches 32 are extended into the exposed portions of the sections 10b of the semiconductor fins 10 inside the boundary of the opening 27 in the etch mask 26 with an etching process, such as a reactive ion etching process. The etching process removes the material of the sections 10b of semiconductor fins 10 selective to the materials of the sidewall spacers 20 and pillars 30. The etching process may extend the trenches 32 fully through the height of the exposed portions of the sections 10b of semiconductor fins 10 and to a shallow depth of penetration into the substrate 12. The formation of the trenches 32 removes portions of the sections 10b of semiconductor fins 10 that are arranged below the former locations of the removed sections of the gate structures 16 and that extend across the full width of the semiconductor fins 10.

Figure 9:
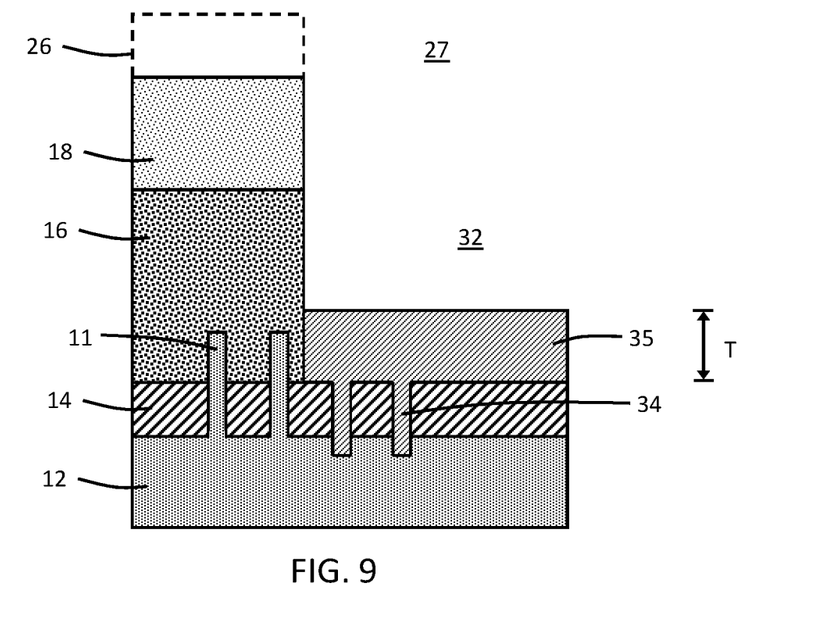
Figure 9A:
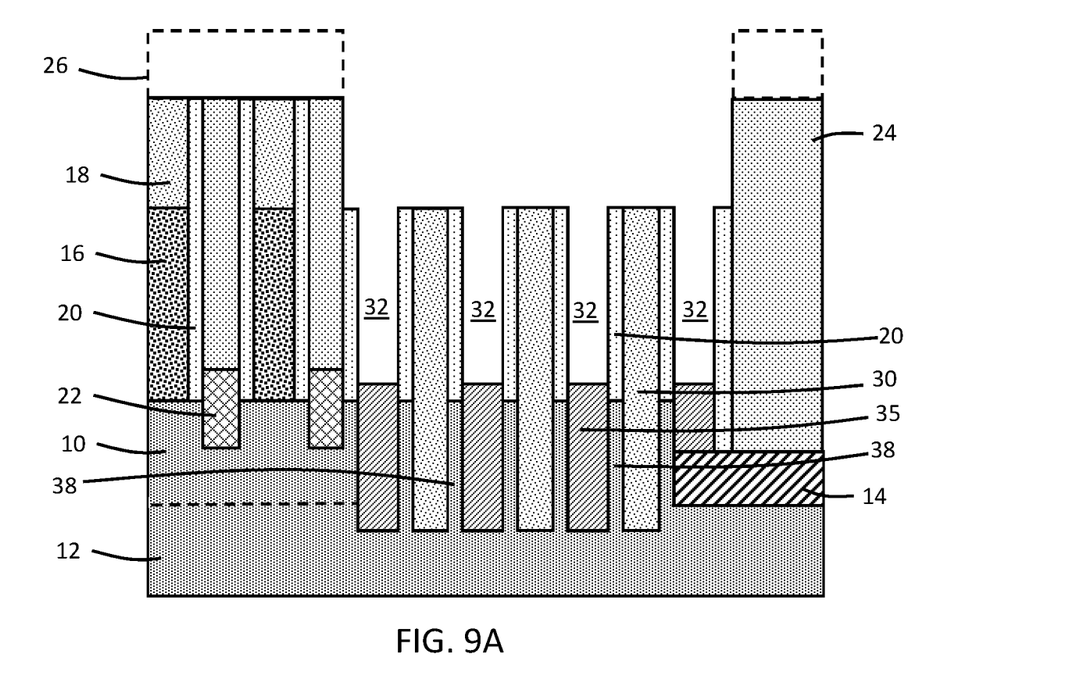

With reference to FIGS. 9, 9A in which like reference numerals refer to like features in FIGS. 8, 8A and at a subsequent fabrication, a dielectric layer 35 is deposited that includes pillars 34 that are arranged in a lower portion of the trenches 32 within the semiconductor fins 10. The pillars 34 have a thickness, t, that extends above a top surface of the semiconductor fins 10, and the pillars 34 also extend to a shallow depth into the substrate 12 below the interface between the lower section of each semiconductor fin 10 and the substrate 12. The pillars 34 may be composed of a dielectric material, such as a low-temperature silicon oxide (LTO), that is deposited and etched back with an etching process to provide the thickness, t. The dielectric material of the pillars 34 is selected to be removed selective to the dielectric materials of the sidewall spacers 20 and the pillars 30.

The pillars 34 extend across the entire width of the sections 10b of semiconductor fins 10 and through the full height of the semiconductor fins 10. Each pillar 34 has a lower section inside the lower section of the semiconductor fins 10 that is surrounded in part by the shallow trench isolation regions 14. Portions 38 of the semiconductor fins 10 may not be removed when forming the pillars 30 and the pillars 34. These portions 38 of the semiconductor fins 10 are arranged vertically beneath the sidewall spacers 20, which masks the portions 38 during the etching processes forming the trenches 28 (FIGS. 5, 5A) and the trenches 32 (FIGS. 7, 7A). Each portion 38 of the semiconductor fins 10 is arranged laterally on two of its sides between one of the pillars 30 and one of the pillars 34. A lower section of each portion 38 of the semiconductor fins 10 is arranged on its other two sides between the shallow trench isolation regions 14, and an upper section of each portion 38 of the semiconductor fins 10 is also arranged on its other two sides between sections of the dielectric layer 35.

Figure 10:
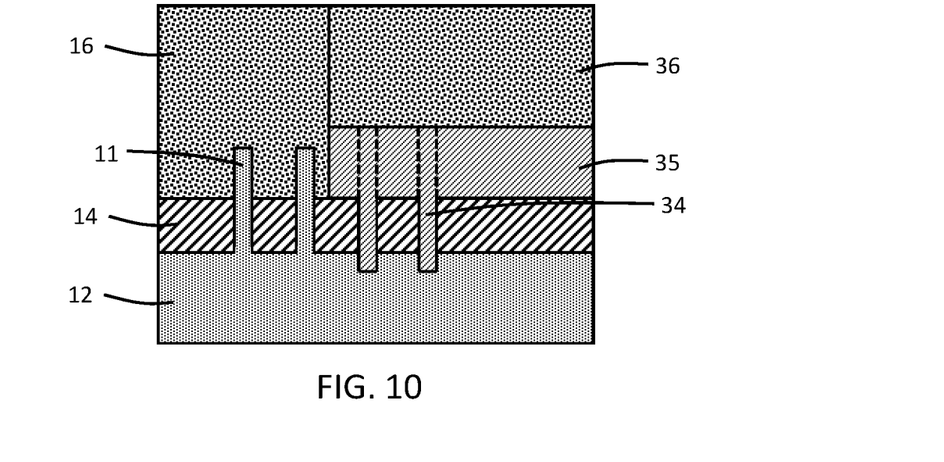
Figure 10A:
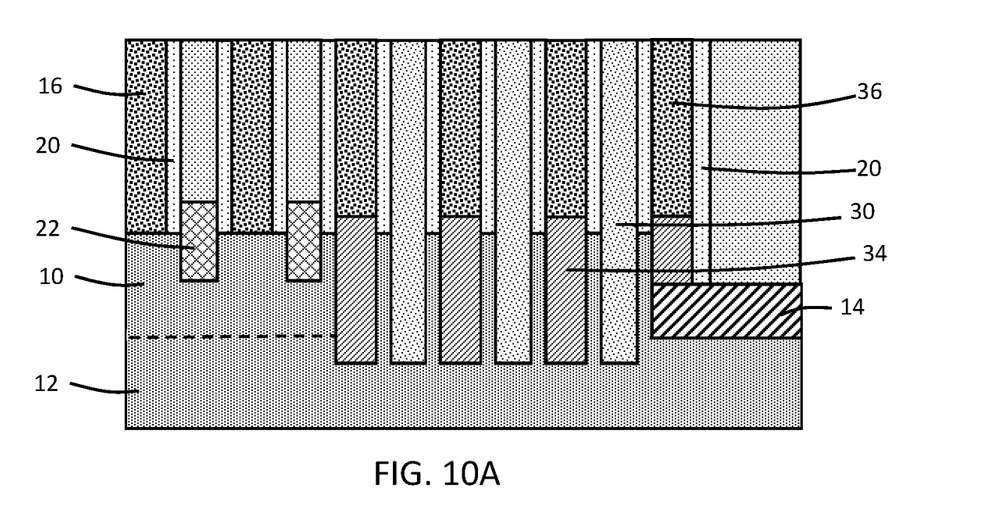

With reference to FIGS. 10, 10A in which like reference numerals refer to like features in FIGS. 9, 9A and at a subsequent fabrication, the etch mask 26 is removed, and dummy gate structures 36 are formed inside respective upper portions of the trenches 32 that are arranged over the dielectric layer 35 and between the sidewall spacers 20. In particular, the dummy gate structures 36 are arranged in part over the pillars 34. The dummy gate structures 36 may be composed of an amorphous semiconductor material, such as amorphous silicon. The dummy gate structures 36 replace the sections of the gate structures 16 removed in connection with the fabrication stage of FIGS. 7, 7A, and are shorter than the gate structures 16 due to the height of the underlying pillars 34.

Figure 11:
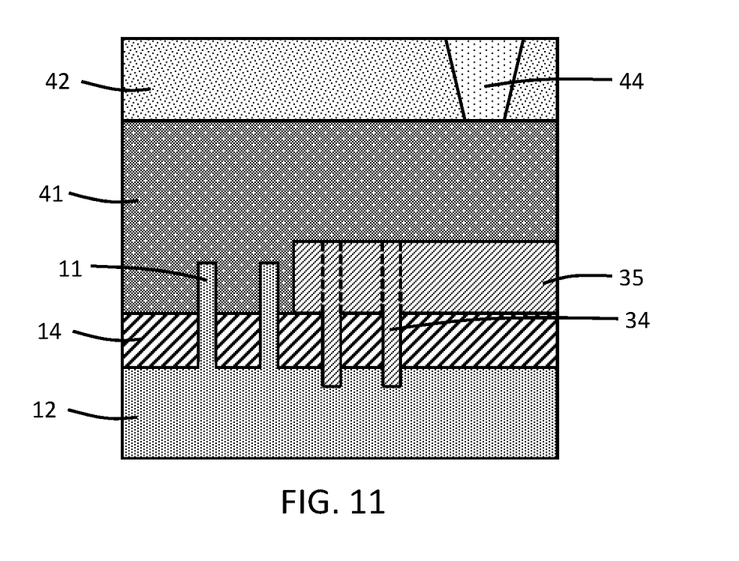
Figure 11A:
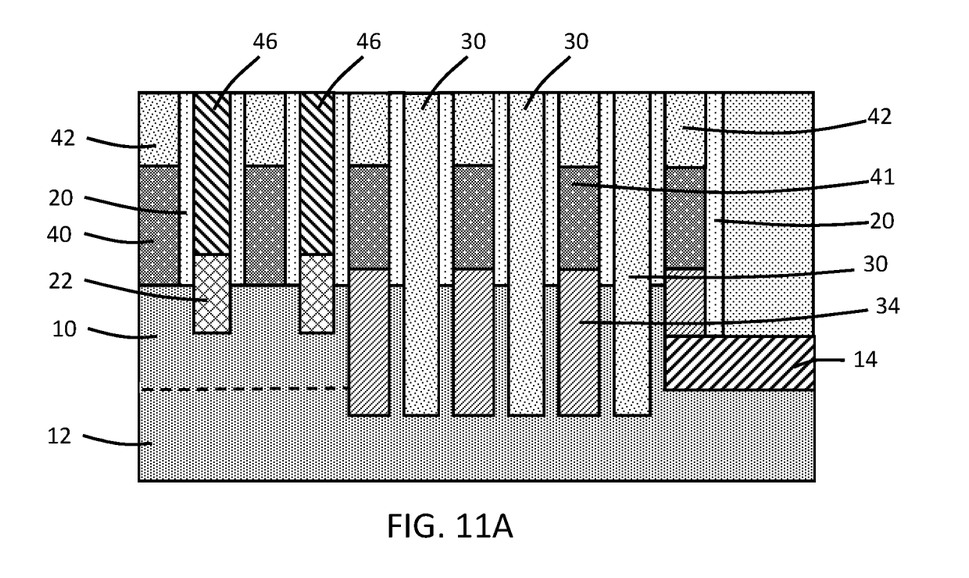
Figure 12:
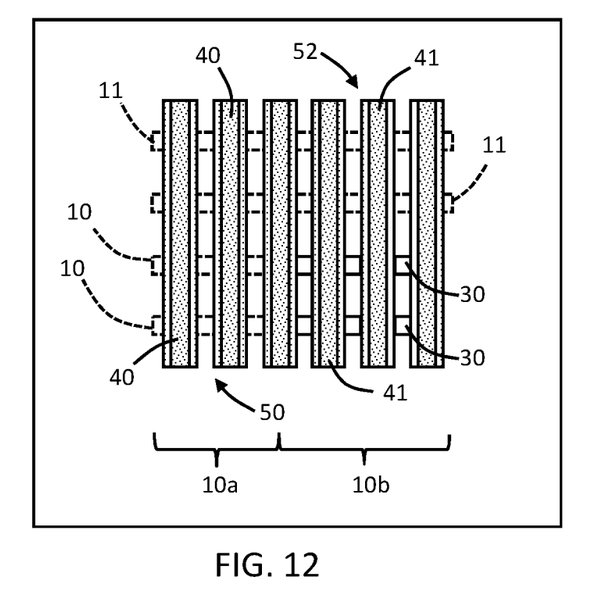
FIG. 12 is a diagrammatic view showing the gate structures and semiconductor fins of the completed device structure of FIGS. 11, 11A and in which the view is simplified for purposes of clarity of description.

With reference to FIGS. 11, 11A, 12 in which like reference numerals refer to like features in FIGS. 10, 10A and at a subsequent fabrication, the gate structures 16 are removed and replaced with gate structures 40, and the gate structures 36 are removed and replaced with gate structures 41. The gate structures 41 extend across and overlap with the pillars 30, the pillars 34, and residual portions 38 of the semiconductor fins 10 that replace the lengthwise sections 10b of the semiconductor fins 10. The gate structures 41 also extend across and overlap with the semiconductor fins 11. The gate structures 40 extend across and overlap with the sections 10a of the semiconductor fins 10 and the semiconductor fins 11.

Each of the gate structures 40, 41 includes a gate electrode and a gate dielectric interposed between the gate electrode and the semiconductor material of the semiconductor fins 10, 11. The gate structures 40, 41 may be formed by depositing different layers of materials, chamfering with etching processes, and polishing. The gate dielectrics of the gate structures 40, 41 may be composed of a dielectric material, such as a high-k dielectric material like hafnium oxide ($HfO_2$), deposited by atomic layer deposition. The gate electrodes of the gate structures 40, 41 may include one or more conformal barrier metal layers and/or work function metal layers, such as layers composed of titanium aluminum carbide (TiAlC) and/or titanium nitride (TiN), deposited by atomic layer deposition and a metal gate fill layer composed of a conductor, such as tungsten (W). The gate electrodes may include different combinations of the conformal barrier metal layers and/or work function metal layers to form different types of field-effect transistors. For example, the gate electrodes may include conformal work function metal layers characteristic of an n-type field-effect transistor Self-aligned-contact (SAC) caps 42 are formed in the respective spaces between the sidewall spacers 20 over the gate structures 40 and the gate structures 41. The self-aligned-contact caps 42 may be composed of silicon nitride ($Si_3N_4$) deposited by chemical vapor deposition (CVD) and planarized by chemical mechanical polishing (CMP). A contact 44 is formed that extends to one of the gate structures 41.

The sections of the interlayer dielectric layer 24 over the source/drain regions 22 are removed, and contacts 46 are formed in the opened spaces. The contacts 46 extend vertically to physically and electrically contact the source/drain regions 22. The contacts 46 may contain a metal silicide, such as tungsten silicide ($WSi_2$), titanium silicide ($TiSi_2$), nickel silicide (NiSi), or cobalt silicide ($CoSi_2$), formed by silicidation adjacent to the source/drain regions 22, as well as a conductor, such as tungsten (W), over the metal silicide.

As best shown in FIG. 12, the completed tapered device structure includes a fin-type field-effect transistor 50 and a fin-type field-effect transistor 52. The semiconductor fins 10 are effectively shortened in length by the formation of the pillars 30 and the pillars 34 replacing the majority of the lengthwise sections 10b. As a result of the length shortening, the fin-type field-effect transistor 50 of the tapered device structure includes channel regions in the semiconductor fins 11 and the sections 10a of the semiconductor fins 10 that are overlapped by the gate structures 40, and the fin-type field-effect transistor 52 of the tapered device structure includes channel regions only in the semiconductor fins 11 that are overlapped by gate structures 41. The fin-type field-effect transistor 50 further includes the source/drain regions 22 connecting the semiconductor fins 10 and the source/drain regions 22 connecting the semiconductor fins 11, and the fin-type field-effect transistor 52 further includes the source/drain regions 22 connecting the semiconductor fins 11.

The introduction of the pillars 30 and the pillars 34 to effectively shorten the semiconductor fins 10 eliminates any detrimental effect from the corner rounding of the opening 27 in the etch mask 26 that is used to define the area for the fin cut. In addition, the semiconductor fins 10 are shortened without the complexity and misalignment of cuts formed by multiple-color patterning.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane. Terms such as "above" and "below" are used to indicate positioning of elements or structures relative to each other as opposed to relative elevation.

A feature "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure for a fin-type field-effect transistor, the structure comprising:
   a semiconductor fin having a top surface;
   a first pillar in the semiconductor fin, the first pillar extending through a height of the semiconductor fin and across a width of the semiconductor fin;
   a second pillar in the semiconductor fin, the second pillar extending through the height of the semiconductor fin and across the width of the semiconductor fin;
   a third pillar in the semiconductor fin, the third pillar extending through the height of the semiconductor fin and across the width of the semiconductor fin, and the third pillar arranged along a length of the semiconductor fin between the first pillar and the second pillar;
   a first gate structure extending over the first pillar;
   a second gate structure extending over the second pillars;
   a first sidewall spacer on the top surface of the semiconductor fin, the first sidewall spacer positioned adjacent to the third pillar and the first gate structure; and
   a third gate structure extending over a first portion of the semiconductor fin,
   wherein the first pillar and the second pillar are comprised of a first dielectric material, the third pillar is comprised of a second dielectric material, the second gate structure is arranged along the length of the semiconductor fin between the first gate structure and the third gate structure, the third pillar is arranged along the length of the semiconductor fin between the first pillar and the second pillar, a second portion of the semiconductor fin is arranged along the length of the semiconductor fin between the first pillar and the third pillar, a third portion of the semiconductor fin is arranged along the length of the semiconductor fin between the second pillar and the third pillar, and the second portion of the semiconductor fin is arranged vertically beneath the first sidewall spacer.

2. The structure of claim 1 wherein the first pillar has a first height, and the third pillar has a second height that is greater than the first height.

3. The structure of claim 1 further comprising:
   a second sidewall spacer on the top surface of the semiconductor fin, the second sidewall spacer positioned adjacent to the second gate structure and between the second gate structure and the third gate structure, and the third portion of the semiconductor fin arranged vertically beneath the second sidewall spacer.

4. The structure of claim 1 wherein the first dielectric material is different in composition from the second dielectric material.

5. The structure of claim 4 wherein the first dielectric material is silicon dioxide, and the second dielectric material is silicon nitride.

6. The structure of claim 4 wherein the first pillar and the second pillar have a first height, and the third pillar has a second height that is greater than the first height.

7. The structure of claim 1 wherein the semiconductor fin is free of a source/drain region beneath the second pillar.

8. The structure of claim 3 wherein the second portion of the semiconductor fin is arranged directly between the first pillar and the third pillar, and the third portion of the semiconductor fin is arranged directly between the second pillar and the third pillar.

9. The structure of claim 1 wherein the semiconductor fin is arranged over a substrate, the first pillar, the second pillar, and the third pillar each extend fully through a thickness of the semiconductor fin, and the first pillar, the second pillar, and the third pillar each include a portion positioned in the substrate beneath the semiconductor fin.

10. The structure of claim 1 wherein the third pillar extends above the top surface of the semiconductor fin.

* * * * *